(12) United States Patent
Kim (10) Patent No.: US 7,466,153 B2
(45) Date of Patent: Dec. 16, 2008

(54) APPARATUSES FOR INSPECTING POGO PINS OF AN ELECTRICAL DIE SORTING SYSTEM AND A METHOD FOR PERFORMING THE SAME

(75) Inventor: Jung-Nam Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/490,120

(22) Filed: Jul. 21, 2006

(65) Prior Publication Data

US 2007/0024305 A1 Feb. 1, 2007

(30) Foreign Application Priority Data

Jul. 29, 2005 (KR) ............... 10-2005-0069611

(51) Int. Cl.
*G01R 31/02* (2006.01)
(52) U.S. Cl. ............................................. 324/754
(58) Field of Classification Search ............. 324/754, 324/761
See application file for complete search history.

(56) References Cited

U.S. PATENT DOCUMENTS

| 5,530,374 A * | 6/1996 | Yamaguchi ............ 324/758 |
|---|---|---|
| 6,348,810 B1 | 2/2002 | Yanagawa et al. ........ 324/765 |
| 6,541,992 B2 * | 4/2003 | Wei et al. ............. 324/761 |
| 6,794,887 B1 * | 9/2004 | Nelson et al. ........... 324/754 |
| 7,239,159 B2 * | 7/2007 | Grube et al. ........... 324/754 |
| 7,271,014 B2 * | 9/2007 | Sato ..................... 438/14 |
| 2002/0039802 A1 | 4/2002 | Ban et al. |
| 2003/0014728 A1 * | 1/2003 | Shaeffer et al. .......... 716/15 |
| 2004/0148122 A1 * | 7/2004 | Whitten et al. ......... 702/120 |

FOREIGN PATENT DOCUMENTS

| KR | 1999-46172 | 7/1999 |
|---|---|---|
| KR | 10-2003-0094790 | 12/2003 |

\* cited by examiner

*Primary Examiner*—Jermele M Hollington
(74) *Attorney, Agent, or Firm*—Harness, Dickey & Pierce, P.L.C.

(57) ABSTRACT

Apparatuses for inspecting pogo pins of an electrical die sorting (EDS) system are provided and a method for performing the same are provided. Apparatuses for inspecting pogo pins that delivers electrical signals between a tester and a probe when dies on a substrate are electrically tested are also provided. The apparatuses may include a lower plate, an upper plate and/or a sensing unit. The lower plate may be positioned under a pogo block including the pogo pins. The lower plate may include a conductive layer electrically connected to lower end portions of the pogo pins. The upper plate may be positioned over the pogo block. The upper plate may include conductive plugs corresponding to upper portions of the pogo pins. The sensing unit, for generating signals, may be coupled to an electrical contact between the conductive plugs and the pogo pins.

14 Claims, 5 Drawing Sheets

APPARATUSES FOR INSPECTING POGO PINS OF AN ELECTRICAL DIE SORTING SYSTEM AND A METHOD FOR PERFORMING THE SAME

PRIORITY STATEMENT

This application claims the benefit of priority under 35 U.S.C. § 119 from Korean Patent Application No. 2005-69611, filed on Jul. 29, 2005 in the Korean Intellectual Property Office, the contents of which are herein incorporated by reference in their entirety.

BACKGROUND OF THE INVENTION

1. Field of the Invention

Example embodiments of the present invention relate to apparatuses for inspecting pogo pins of an electrical die sorting (EDS) system and a method for performing the same. Other example embodiments of the present invention relate to apparatuses for inspecting pogo pins of an EDS system for electrically testing a plurality of dies formed on a semiconductor substrate and a method for performing the same.

2. Description of the Related Art

Generally, a semiconductor device may be manufactured by performing a fabrication (FAB) process for forming a circuit on a semiconductor substrate (e.g., a silicon wafer), an electrical die sorting (EDS) process for inspecting electrical characteristics of the circuit formed on the substrate and/or a packaging process for sealing the semiconductor device using an epoxy resin.

The fabrication processes may be divided into a deposition process for forming a layer on the substrate, a chemical mechanical polishing (CMP) process for planarizing the layer, a photolithography process for forming a photoresist pattern on the layer, an etching process for forming an electrical pattern from the layer using the photoresist pattern, an ion implantation process for implanting ions into a desired region of the substrate, a cleaning process for removing particles from the substrate and/or an inspection process for inspecting for electrical defects in the pattern.

In the EDS process, electrical signals may be applied (or transmitted) to dies on the substrate and/or data corresponding to the electrical signal may be analyzed to inspect (or evaluate) electrical characteristics of the dies.

Figure 1:
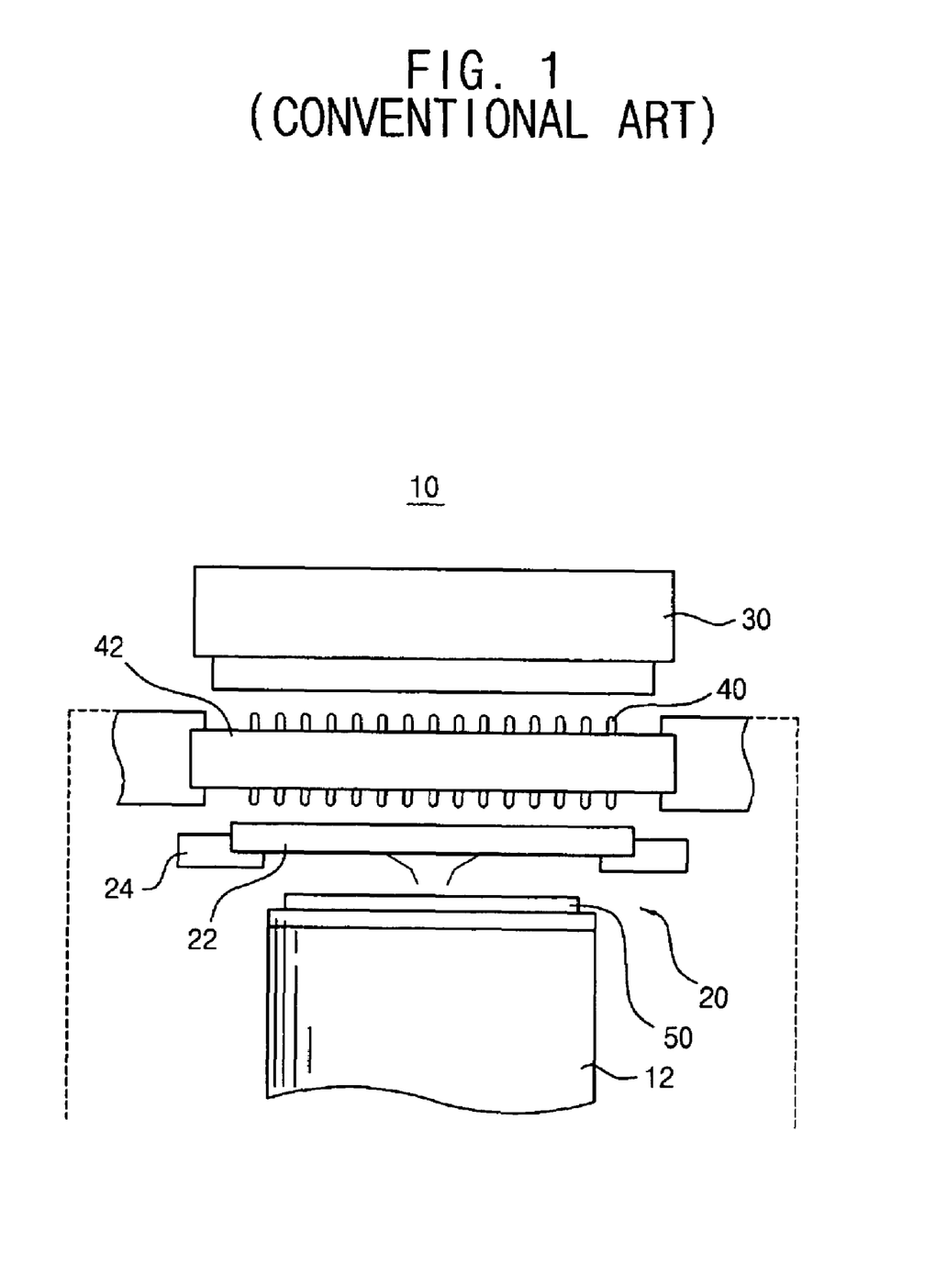
FIG. 1 is a diagram illustrating a cross-sectional view of a conventional electrical die sorting (EDS) apparatus.

FIG. 1 is a diagram illustrating a cross-sectional view of a conventional EDS system.

Referring to FIG. 1, a conventional EDS system 10 used to perform the EDS process may include a probe 20 having a probe card 22, a tester 30 electrically connected to the probe card 22 and/or a pogo block 42 including a plurality of pogo pins 40. The probe card 22 may include a plurality of probe needles electrically connected to a semiconductor substrate 50. The pogo pins 40 may electrically connect the probe 20 to the tester 30. The pogo pins 40 may protrude from a lower surface and an upper surface of the pogo block 42, which is interposed between the probe 20 and the tester 30, such that the pogo pins 40 penetrate into the pogo block 42. For example, the pogo block 42 may include 512 pogo pins.

The EDS system 10 may also include the probe card stage 24 for supporting the probe card 22. The substrate 50 may be supported by a substrate stage 12 under the probe card 22.

The probe card 22 may be electrically connected to the tester 30 through the pogo pins 40. At least one of the dies (not shown) on semiconductor substrate 50 may be electrically connected to the probe card 22 by lifting the substrate stage 12. A pad electrode (not shown) may be positioned on each of the die to ensure an electrical connection of the die to the probe needles. The electrical connection of the die to the probe needles may be formed by lifting the substrate stage 12 such that the probe needles contact the pad electrode.

Each of the pogo pins 40 may include a housing penetrating the pogo block 42, connection portions inserted into end portions of the housing, a plurality of balls positioned between the end portions and/or a plurality of springs positioned between the balls.

When the tester 30 is connected to the probe 20 through the pogo pins 40, the pogo pins 40 may function as buffers between the tester 30 and the probe 20. When the springs in each of the pogo pins is not secure (or loosen), the pogo pins may not efficiently transfer an electrical signal between the tester 30 and the probe 20.

The electrical connection of the die with the probe needles may be determined by an electrical connection of between the plurality balls and springs with each other in each of the pogo pins 40. According to a conventional method of ensuring the electrical connection of the balls and the springs in each pogo pin 40, the pogo block 42 may be separated from the EDS system 10. An operator may visually inspect each of the pogo pins 40 in the pogo block 42 or electrically inspect each of the pogo pins 40 by testing the electrical connection of each pogo pin 40 for defects using a resistance measurement system. The conventional method of inspecting the pogo pins 40 may require a relatively longer amount of time and/or be more complicated to prepare.

SUMMARY OF THE INVENTION

Example embodiments of the present invention relate to apparatuses for inspecting pogo pins of an electrical die sorting (EDS) system and a method for performing the same. Other example embodiments of the present invention relate to apparatuses for inspecting pogo pins of an EDS system for electrically testing a plurality of dies formed on a semiconductor substrate and a method for performing the same.

Example embodiments of the present invention provide apparatuses capable of inspecting pogo pins of an electrical die sorting (EDS) system more efficiently.

According to example embodiments of the present invention, there is provided an apparatus for inspecting pogo pins that delivers electrical signals between a tester and a probe when dies on a substrate are electrically tested. The apparatus for inspecting the pogo pins may include lower and upper plates and/or a sensing unit. The lower plate may be positioned under a pogo block including the pogo pins. The lower plate may include a conductive layer electrically connected to lower end portions of the pogo pins. The upper plate may be positioned over the pogo block. The upper plate may include conductive plugs corresponding to upper portions of the pogo pins. The sensing unit, which may generate signals, may be coupled to an electrical contact between the conductive plugs and the pogo pins.

In example embodiments of the present invention, the sensing unit may include a power supply providing a voltage difference between the conductive layer and the conductive plugs and/or a plurality of sensors connected to the power supply and the conductive plugs. In example embodiments of the present invention, the sensor may include a light-emitting diode (LED).

In example embodiments of the present invention, a metal wiring may be on the upper plate. The metal wiring may be electrically connected to the sensor and the power supply. The upper plate may include a first connection member for connecting the metal wiring to the power supply. The lower plate may include a second connection member for connecting the conductive layer to the power supply.

In example embodiments of the present invention, the apparatus for inspecting the pogo pins may also include a driving part for moving the upper plate toward the pogo block such that the conductive plug contacts an upper potion of each of the pogo pins.

In example embodiments of the present invention, the lower plate may include a screw hole. The driving part may include a screw joint that penetrates the upper plate and the pogo block. The driving part may be fixed into the screw hole of the lower plate by a screw coupling, the screw joint including a head portion and/or an axis integrally formed on the head portion as one body. The axis may have screw threads on a circumferential surface thereof.

The driving part may include a bearing used between the upper plate and the axis of the screw joint. The driving part may be coupled to the upper plate and the axis such that the upper plate rotates independently of the axis of the screw joint when the screw joint moves (e.g., downward or upward). The driving part may also include a guiding member for guiding movement (e.g., vertically) of the upper plate in such way that each of the conductive plugs contacts with a corresponding upper portion of each of the pogo pins. The guiding member may extend from a bottom surface of the upper plate. The guiding member may penetrate the lower plate through a guiding hole in the lower plate.

According to example embodiments of the present invention, a method for inspecting the pogo pins may include positioning the lower plate on a probe card stage such that the conductive layer contacts the lower end portions of the pogo pins; positioning the upper plate over the pogo block such that guiding members extending from the upper plate are inserted into guiding holes in the lower plate; applying a voltage between the conductive plugs and the pogo pins and/or detecting the signals generated by the sensing unit.

According to example embodiments of the present invention, the pogo pins in the pogo block may be inspected using to the claimed apparatus and method, reducing an amount of time for inspecting the pogo pins. The gap distance between the pogo block and the upper plate may be easier to regulate by adjusting a screw distance of the driving part. By regulating the gap distance, it may be easier to evaluate a brightness of the LED in order to determine whether it is necessary to replace a pogo pin.

BRIEF DESCRIPTION OF THE DRAWINGS

Example embodiments of the present invention will be more clearly understood from the following detailed description taken in conjunction with the accompanying drawings. FIGS. 1-7 represent non-limiting, example embodiments of the present invention as described herein.

DESCRIPTION OF THE EXAMPLE EMBODIMENTS

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to apparatuses for inspecting pogo pins of an electrical die sorting (EDS) system and a method for performing the same. Other example embodiments of the present invention relate to apparatuses for inspecting pogo pins of an EDS system for electrically testing a plurality of dies formed on a semiconductor substrate and a method for performing the same.

Figure 2:
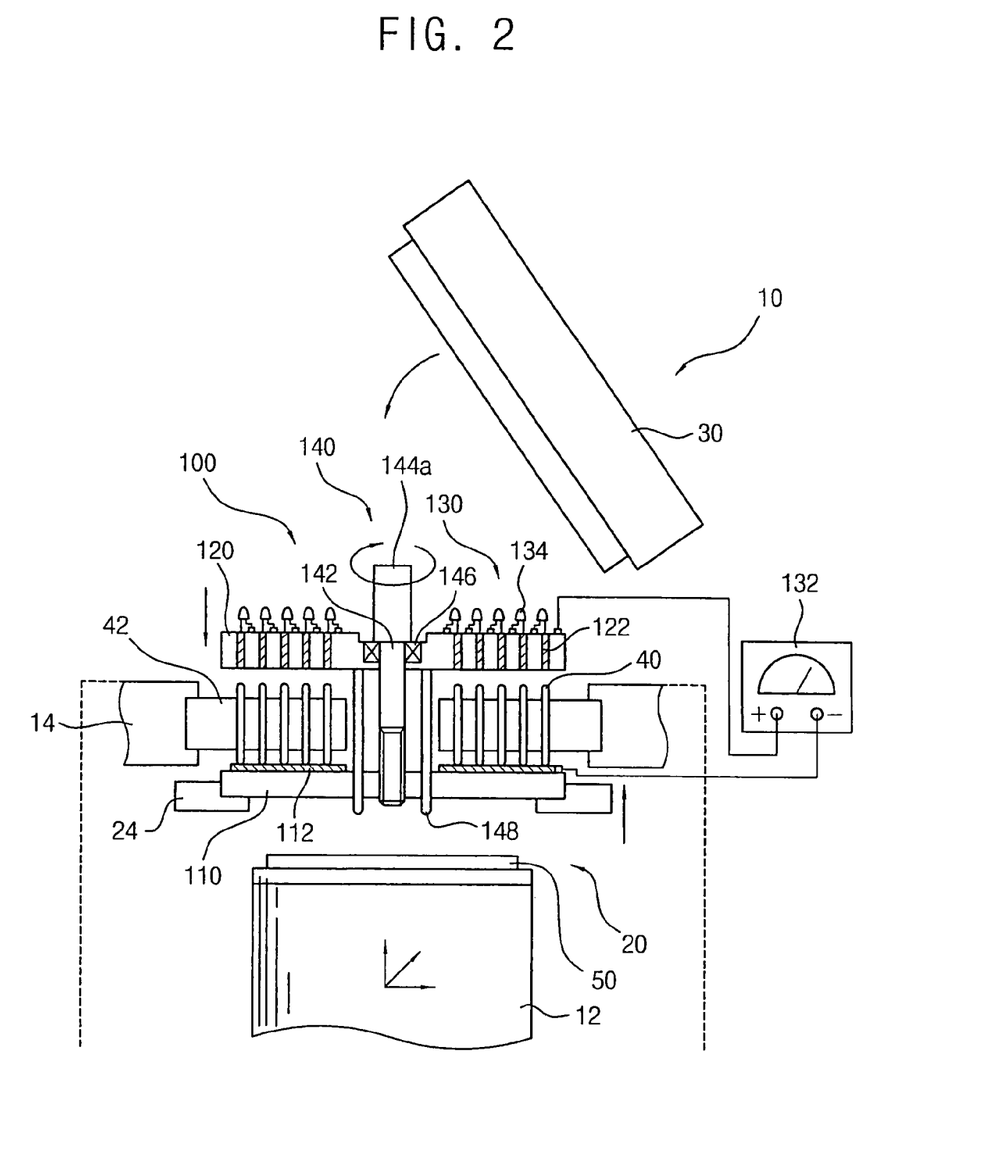
FIG. 2 is a diagram illustrating a cross-sectional view of an apparatus for inspecting pogo pins of an EDS system according to example embodiments of the present invention.
Figure 3:
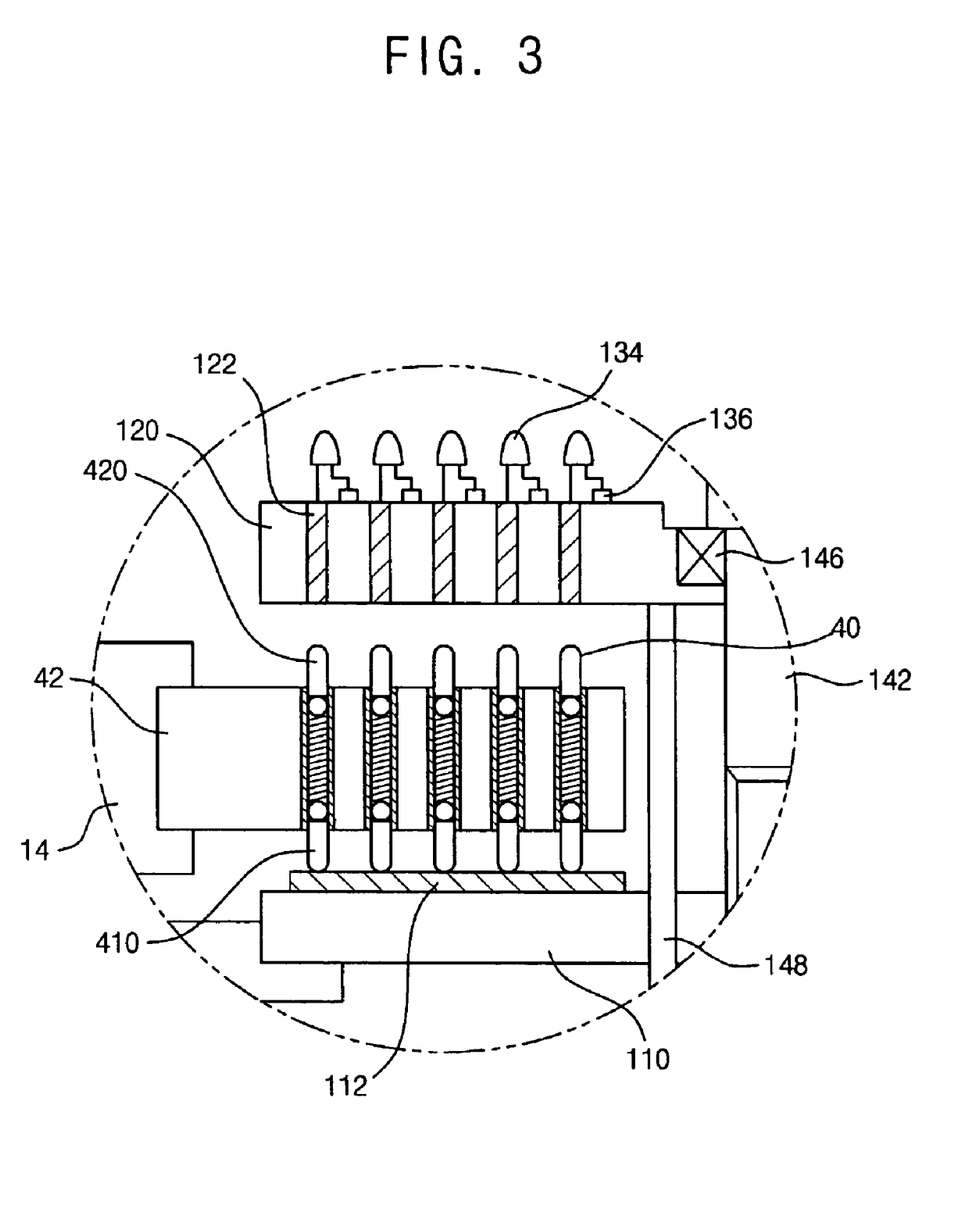
FIG. 3 is a diagram illustrating an enlarged cross-sectional view of the pogo pins in FIG. 2.

FIG. 2 is a diagram illustrating a cross-sectional view of an apparatus for inspecting pogo pins of an electrical die sorting (EDS) system according to example embodiments of the present invention. FIG. 3 is an enlarged cross-sectional view illustrating pogo pins shown in FIG. 2.

Referring to FIGS. 2 and 3, example embodiments of the present invention provide an apparatus 100 that may be used to inspect a plurality of pogo pins 40 of an EDS system 10, which performs an EDS process on a plurality of dies (not shown) on a semiconductor substrate 50 (e.g., a silicon wafer) manufactured through a fabrication (FAB) process.

The EDS system 10 may include a tester 30 and/or a probe 20. The tester 30 may apply electrical signals to the dies to test electrical characteristics of the dies. The probe 20 may deliver the electrical signals to pad electrodes on the dies.

The probe 20 may include a probe card 22 having contact pins in contact with the pad electrodes, a substrate stage 12 supporting the semiconductor substrate 50 and/or a probe card stage 24 supporting the probe card 22. The substrate stage 12 and the probe card stage 24 may be configured to allow movement in different directions (e.g., a horizontal direction and a vertical direction) with respect to the semiconductor substrate 50.

A pogo block 42 including a plurality of pogo pins 40 may be interposed between the probe 20 and the tester 30. The pogo block 42 may be connected to a main body 14 of the EDS system 10. The pogo pins 40 may penetrate the pogo block 42. As shown in FIG. 3, first end portion 410 and second end portion 420 of each of the pogo pins 40 may protrude from bottom and top surfaces of the pogo block 42, respectively.

In example embodiments of the present invention, the tester 30 may be hinged on the main body 14 of the EDS system 10. The tester 30 may be attached to the top surface of the pogo block 42 such that the tester 30 is capable of movement in a desired direction(e.g., in a vertical direction).

Variations of the elements in the EDS system 10 may be expected and the example embodiments of the present invention should not be construed as limited to the above elements in the EDS system 10.

The apparatus 100 may include a lower plate 110, an upper plate 120 and/or a sensing unit 130.

The lower plate 110 may be positioned on the probe card stage 24 under the pogo block 42. The lower plate 110 may have substantially the same shape as the probe card 22. A conductive layer 112 may be formed on the lower plate 110. The conductive layer 112 may be electrically connected to the first end portions 410 of the pogo pins 40 when the probe card stage 24 ascends (e.g., in the vertical direction).

The upper plate 120 may be positioned over the pogo block 42. The upper plate 120 may have a disk shape. The upper plate 120 may include a plurality of conductive plugs 122 corresponding to the second end portions 420 of the pogo pins 40.

The sensing unit 130 may generate signals when the conductive plugs 122 electrically contact the second end portions 420 of the pogo pins 40. The signals may be used for inspecting an operation status of the pogo pins 40.

In example embodiments of the present invention, the sensing unit 130 may include a power supply 132 and light-emitting diodes (LEDs) 134. The power supply 132 provides a voltage difference between the conductive layer 112 and the conductive plugs 122. The LEDs 134, which may be connected to the power supply 132 and the conductive plugs 122, may generate the signals.

The LEDs 134 may include first terminals and second terminals. Each of the first terminals may be electrically connected to each of the conductive plugs. The second terminals may be electrically connected to the power supply 132. For example, the upper plate 120 may also include metal wirings 136, which connect the second terminals of the LEDs 134 to the power supply 132.

The lower plate 110 and the upper plate 120 may also include a first connection member 114 (shown in FIG. 4) and/or a second connection member 124 (shown in FIG. 5), each of which connects the conductive layer 112 and the metal wirings 136 to the power supply 132. In example embodiments of the present invention, the first connection member 114 and the second connection member 124 may include a first outlet and a second outlet. A first plug and a second plug, which may be coupled to the first and the second outlets, respectively, are positioned at end portions of a first power cable and a second power cable, respectively. The first and the second power cables extend from a minus terminal and a plus terminal, respectively, of the power supply 132.

The pogo block 42 may include a plurality of pinholes into which the pogo pins 40 are inserted. Each of the pinholes may include a housing positioned in the pinholes, lower and upper end portions 410 and 420 connected to end portions of the housing, a coil spring positioned in the housing and/or a pair of balls positioned between the lower portion 410 and the coil spring and between the upper portion 420 and the coil spring. The coil spring may function as a buffer when the lower portion 410 and the upper portion 420 are connected to the tester 30 and the probe card 22, respectively. Variations of the elements of the pogo pins 40 may be expected and example embodiments of the present invention should not be construed as limited to the above elements in the pogo pins 40.

Figure 4:
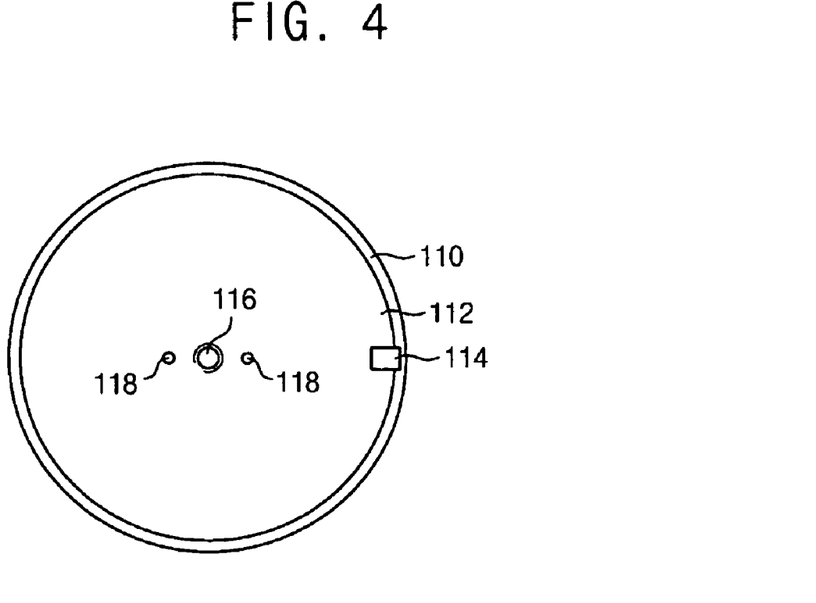
FIG. 4 is a diagram illustrating a plan view of the lower plate shown in FIG. 2.
Figure 5:
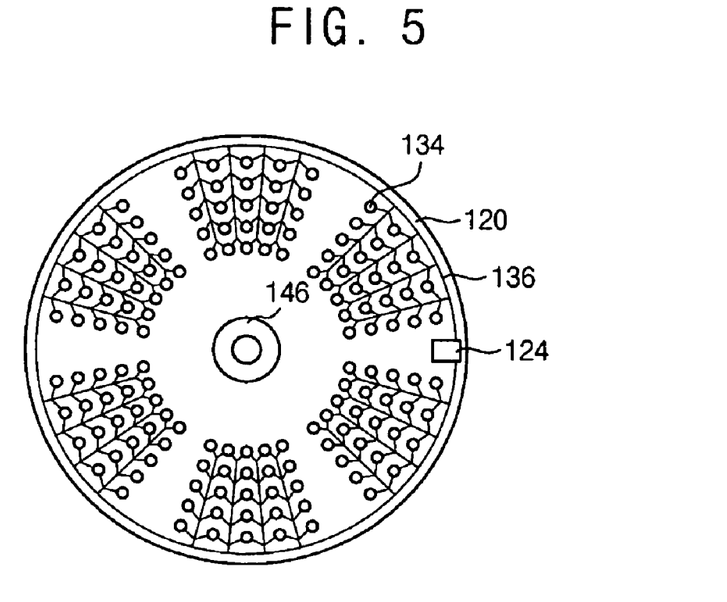
FIG. 5 is a diagram illustrating a plan view of the upper plate shown in FIG. 2.

FIG. 4 is a diagram illustrating a plan view of the lower plate 110 shown in FIG. 2. FIG. 5 is a diagram illustrating a plan view of the upper plate 120 shown FIG. 2.

Referring to FIGS. 2 to 5, the apparatus 100 may include a driving part 140 for moving the upper plate 120. The upper plate 120 may move toward the upper portion 420 of the pogo pins 40 by the driving part 140 such that the conductive plugs 122 of the upper plate 120 contact the upper portions 420 of the pogo pins 40.

In example embodiments of the present invention, the lower plate 110 may include a screw hole 116 at a central portion thereof. The driving part 140 may include a screw joint that penetrates the upper plate 120 and the pogo block 42. The driving part 140 may be fixed into the screw hole 116 by a screw coupling. The driving part 140 may includes a head portion 144a and an axis 142 integrally formed on the head portion 144a as one body. The driving part 140 may include screw threads on a circumferential surface thereof. The driving part 140 may further include a bearing 146 positioned at the central portion of the upper plate 120 such that the upper plate 120 rotates independently of the axis 142 while the driving part 140 is adjusted in a desired direction (e.g., to screw upwardly or downwardly).

The axis of the driving part 140 may be connected to the upper plate 120 using the bearing 146 such that the upper plate may move (e.g., downwardly or upwardly) in accordance with a screw movement of the axis 142 of the driving part 140. For example, the upper plate 120 moves downwardly when the driving part 140 is adjusted downwardly after the conductive layer 112 on the lower plate 110 contacts the lower portions 410 of the pogo pins 40 and the conductive plugs 122 of the upper plate 120 contacts the upper portions 420 of the pogo pins 40, respectively.

When the upper portions 420 of the pogo pins 40 contact the conductive plugs 122 of the upper plate 120, the LED 134 electrically connected to the conductive plugs 122 may emit light. When the coil spring in the pinhole of the pogo block 42 is not secure (e.g., the coil spring may be loose), the LED 134 may not operate. When the electrical connection of the coil springs and the balls in the pinhole is poor, the LED 134 either does not operate or emits relatively dimmer light.

A defective pogo pin may be easier to detect when the pogo pin 40 is coupled to an operation of the LED 134, reducing an amount of time for inspecting the pogo pins 40.

A gap distance between the pogo block 42 and the upper plate 120 may be easier to regulate by adjusting a screw distance of the driving part 140. Regulation of the gap distance may facilitate an evaluation process determining a brightness of the LED 134, making it easier to determine whether it is necessary to replace the pogo pins 40.

Figure 6:
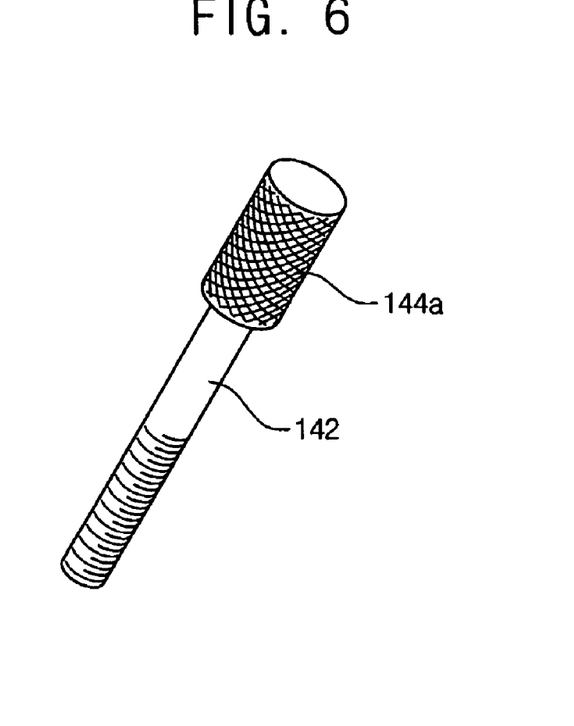
FIG. 6 is a diagram illustrating a perspective view of a screw joint as the driving part shown in FIG. 2 according to example embodiments of the present invention.
Figure 7:
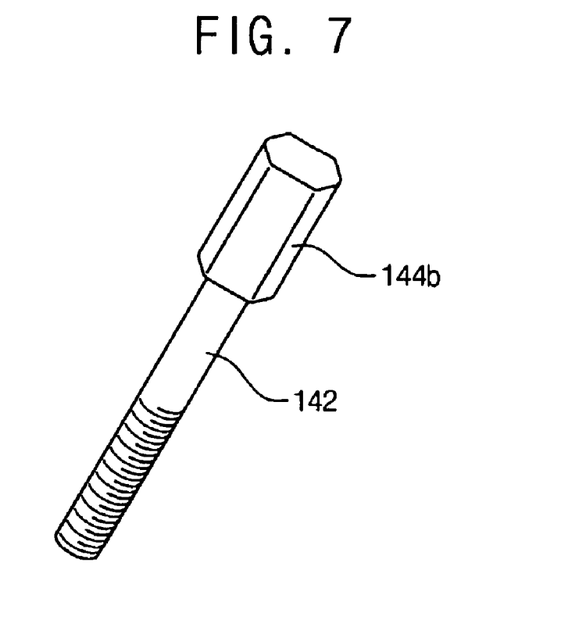
FIG. 7 is a diagram illustrating a perspective view of another screw joint as the driving part shown in FIG. 2 according to example embodiments of the present invention.

FIG. 6 is a diagram illustrating a perspective view of the screw joint as the driving part shown in FIG. 2 according to example embodiments of the present invention. FIG. 7 is a diagram illustrating a perspective view of another screw joint as the driving part shown in FIG. 2 according to example embodiments of the present invention.

Referring to FIG. 6, according to example embodiments of the present invention, the driving part may be a screw joint. The screw joint may include a round cylindrical head portion 144a and the axis 142. The round cylindrical head portion 144a may have a cylindrical shape (e.g., a cross-sectional of the round cylindrical head portion 144a may be a circle). The axis 142 may be integrally connected to the cylindrical head portion 144a. According to other example embodiments of the present invention, the screw joint may have a prism-shaped head portion 144b and the axis 142. The prism-shaped head portion 144b may have a plurality of faces. The axis 142 may also be integrally connected to the prism-shaped head portion 144b.

The round cylindrical head portion 144a may include a knurled circumferential surface to allow easier rotation of the driving part 140.

A hexagonal groove, a cross groove or a slot groove may be formed at a top surface of the prism-shaped head portion 144b, although not shown in FIG. 7. While the above example embodiments discuss the head portion of the screw joint in terms of a cylindrical shape or a prism shape, the head portion of the screw joint may include any other shape known to one of ordinary skill in the art in place of or in conjunction with the above shapes.

As shown in FIGS. 2 to 5, the driving part 140 may also include guiding members 148 for guiding the upper plate 120 to move in the desired direction (e.g., vertically) such that each of the conductive plugs contacts a corresponding upper portion of a pogo pin 40. The guiding members 148 may extend from a bottom surface of the upper plate 120. The guiding members 148 may penetrate the lower plate 110 through guiding holes 118 in the lower plate 110.

Although example embodiments of the present invention disclose the driving part 140 including a pair of the guiding members 148, the number of the guiding members should not be construed as limited to the scope of the present invention, as would be known to one of ordinary skill in the art A method of inspecting the pogo pins of the EDS system using the pogo pin inspection apparatus will now be described.

The lower plate 110 may be positioned on the probe card stage 24. The probe card stage 24 may move (e.g., upwardly)

toward the lower plate 110 such that the conductive layer 112 of the lower plate 110 contacts the lower portions 410 of the pogo pins.

The upper plate 120 may be arranged over the pogo block 42 such that the guiding members 148 extending from the upper plate 120 may be inserted into the guiding holes 118 in the lower plate 110.

The power supply 132 may apply a voltage between the conductive plugs 122 of the upper plate 120 and the upper portions 420 of the pogo pins 40. The driving part 140 may adjusted (e.g., to screw downwardly) toward the pogo block 42 such that the upper plate 120 moves (e.g., downwardly) toward the pogo block 42. As a result, the conductive plugs 122 of the upper plate 120 may contact the upper portions 420 of the pogo pins 40.

A defective pogo pin may be detected (or checked) individually by coupling the pogo pin to an operation state of the LED, which is electrically connected to the conductive plugs 122 of the upper plate 120. A variation in brightness of the LED 134 may be evaluated by adjusting the interval of (or distance between) the upper plate 120 and the pogo block 42. Based on the variation in brightness, a determination may be made as to whether or not the coil spring in the pinhole has a sufficient elasticity and whether or not the electrical connection between the coil spring and the ball is sufficient.

According to example embodiments of the present invention, defects in the pogo pin with respect to spring elasticity and an electrical connection defect may be easier to inspect (or evaluate) by checking an operation state of the LED connected to upper portions of the pogo pins. The pogo block including the pogo pins may not necessarily be separated from an EDS system in the inspection process for the pogo pins, reducing the amount of time required to perform an inspection process.

The gap distance between the pogo block and the upper plate may be easier to regulate by adjusting a distance of the driving part. Regulation of the gap distance may facilitate an evaluation process for determining the brightness of the LED, making it easier to determine whether or not it is necessary to replace each of the pogo pins.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments of the present invention disclosed, and that modifications to the disclosed example embodiments, as well as other embodiments, are intended to be included within the scope of the appended claims. The present invention is defined by the following claims, with equivalents of the claims to be included therein.

What is claimed is:

1. An apparatus for inspecting pogo pins, comprising:
    a lower plate positioned under a pogo block including the pogo pins, the lower plate including a conductive layer electricaliy connected to lower end portions of the pogo pins;
    an upper plate positioned over the pogo block, the upper plate including conductive plugs corresponding to upper portions of the pogo pins;
    a sensing unit generating signals, the sensing unit coupled with an electrical contact between the conductive plugs and the pogo pins; and
    a driving part for moving the upper plate toward the pogo block such that each of the conductive plugs contacts an upper portion of each of the pogo pins,
    wherein the apparatus transmits electrical signals between a tester and a probe when dies on a substrate are electrically tested.

2. The apparatus of claim 1, wherein the sensing unit includes:
    a power supply providing a voltage difference between the conductive layer and the conductive plugs; and
    a plurality of sensors connected to the power supply and the conductive plugs.

3. The apparatus of claim 2, wherein each sensor includes a light-emitting diode (LED).

4. The apparatus of claim 2, further comprising metal wirings formed on the upper plate, the metal wirings electrically connected to the plurality of sensors and the power supply.

5. The apparatus of claim 4, wherein the upper plate includes a first connection member for connecting the metal wiring to the power supply, and the lower plate includes a second connection member for connecting the conductive layer to the power supply.

6. The apparatus of claim 1, wherein the lower plate includes a screw hole, and the driving part includes a screw joint that penetrates the upper plate and the pogo block,
    further wherein the driving part is fixed into the screw hole of the lower plate by a screw coupling, the screw joint including a head portion and an axis integrally formed on the head portion as one body, the axis having screw threads on a circumferential surface thereof.

7. The apparatus of claim 6, wherein the head portion is prism-shaped having a plurality of faces.

8. The apparatus of claim 6, wherein the head portion is round and cylindrical shaped.

9. The apparatus of claim 8, wherein the head portion has a knurled outer surface.

10. The apparatus of claim 6, wherein the driving part includes a bearing between the upper plate and the axis of the screw joint.

11. The apparatus of claim 1, wherein the driving part includes a guiding member for guiding the upper plate in a desired direction such that each of the conductive plugs contacts a corresponding upper portion of the pogo pins, the guiding member extending from a bottom surface of the upper plate and penetrating the lower plate through a guiding hole in the lower plate.

12. The apparatus of claim 1, wherein the upper plate has a round disk shape.

13. The apparatus of claim 1, wherein the lower plate has a shape substantially identical to that of a probe card for testing dies on the substrate.

14. The apparatus of claim 13, wherein the lower plate is positioned on a probe card stage for supporting the probe card.

* * * * *